(12) United States Patent
Lauffer et al.

(10) Patent No.: US 6,204,456 B1
(45) Date of Patent: Mar. 20, 2001

(54) FILLING OPEN THROUGH HOLES IN A MULTILAYER BOARD

(75) Inventors: John M. Lauffer, Waverly; Voya R. Markovich, Endwell; Cheryl L. Palomaki, Endicott; William E. Wilson, Waverly, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/159,938

(22) Filed: Sep. 24, 1998

(51) Int. Cl.$^7$ .................................................. H01R 9/09
(52) U.S. Cl. ..................... 174/262; 174/266; 174/265; 29/852
(58) Field of Search .................... 174/262, 264, 174/266, 258, 265; 29/852; 361/792, 793, 794, 795

(56) References Cited

U.S. PATENT DOCUMENTS

| | | | |
|---|---|---|---|
| 3,471,631 | * 10/1969 | Quintana | ............................. 174/264 |
| 3,982,045 | 9/1976 | Kukanskis . | |
| 4,058,401 | 11/1977 | Crivello . | |
| 4,069,055 | 1/1978 | Crivello . | |
| 4,081,276 | 3/1978 | Crivello . | |
| 4,138,255 | 2/1979 | Crivello . | |
| 4,169,732 | 10/1979 | Shipley . | |
| 4,175,963 | 11/1979 | Crivello . | |
| 4,230,814 | 10/1980 | Crivello . | |
| 4,246,147 | 1/1981 | Bakus et al. . | |
| 4,358,552 | 11/1982 | Shinohara et al. . | |
| 4,376,815 | 3/1983 | Oddi et al. . | |
| 4,378,074 | 3/1983 | Brochman . | |

(List continued on next page.)

FOREIGN PATENT DOCUMENTS 2 301 826   12/1996   (GB) .
63-126775   5/1988    (JP) .

OTHER PUBLICATIONS

"Formation of Surface Laminar Circuit on Printed Circuit Board with Plated Through Holes", IBM Technical Disclosure Bulletin, vol. 36, No. 10, p. 511, Oct. 1993.

"Making Integral Multilayer Circuit Boards with Cable Connection", IBM Technical Disclosure Bulletin, vol. 14, No. 3, pp. 701–702, Aug. 1971.

"Improved Composition for a Dry Film Soldermask", IBM Technical Disclosure Bulletin, vol. 33, No. 7, Dec. 1990, p. 162–163.

(List continued on next page.)

Primary Examiner—Jeffrey Gaffin
Assistant Examiner—Kamand Cuneo
(74) Attorney, Agent, or Firm—William N. Hogg

(57) ABSTRACT

Methods of filling apertures, for example, through holes, in substrates are provided. The methods utilize a dielectric film, preferably a photoimageable dielectric film, which is employed to fill the apertures and to form a dielectric film disposed above the substrate at the same time. As a result, the aperture fill material is the same as, and indeed continuous with, the dielectric film which is disposed on the substrate. The method employs the following steps: providing a substrate having apertures; providing a dielectric film disposed on the substrate covering the apertures, reflowing the dielectric film to flow into the apertures and to form a dielectric film adherent to the substrate, to provide a continuous dielectric extending from the dielectric film into the apertures. In certain embodiments, after filling, additional apertures, such as vias, are photoimaged in the dielectric film. Preferably the vias are then metallized, and circuitry formed atop the dielectric film.

32 Claims, 1 Drawing Sheet

U.S. PATENT DOCUMENTS

| | | |
|---|---|---|
| 4,442,197 | 4/1984 | Crivello et al. . |
| 4,451,550 | 5/1984 | Bennett et al. . |
| 4,465,760 | 8/1984 | Leyrer et al. . |
| 4,479,983 | 10/1984 | Appelt et al. . |
| 4,544,623 | 10/1985 | Audykowski et al. . |
| 4,578,425 | 3/1986 | Santorelli . |
| 4,693,961 | 9/1987 | Bauer . |
| 4,701,351 | 10/1987 | Jackson . |
| 4,735,891 | 4/1988 | Budde et al. . |
| 4,820,549 | 4/1989 | Ozaki et al. . |
| 4,855,333 | 8/1989 | Rudik et al. . |
| 4,867,839 | 9/1989 | Sato et al. . |
| 4,882,245 | 11/1989 | Gelorme et al. . |
| 4,882,454 * | 11/1989 | Peterson et al. ............ 174/252 |
| 4,885,319 | 12/1989 | Dougherty et al. . |
| 4,911,786 | 3/1990 | Kindl et al. . |
| 4,940,651 | 7/1990 | Brown et al. . |
| 4,983,252 | 1/1991 | Masui et al. . |
| 4,994,346 | 2/1991 | Meier et al. . |
| 5,026,624 | 6/1991 | Day et al. . |
| 5,079,129 | 1/1992 | Roth et al. . |
| 5,208,067 | 5/1993 | Jones et al. . |
| 5,246,817 | 9/1993 | Shipley, Jr. . |
| 5,264,325 | 11/1993 | Allen et al. . |
| 5,278,010 | 1/1994 | Day et al. . |
| 5,300,402 | 4/1994 | Card, Jr. et al. . |
| 5,304,457 | 4/1994 | Day et al. . |
| 5,315,072 * | 5/1994 | Arai et al. ............ 174/262 |
| 5,397,685 | 3/1995 | Daniels et al. . |
| 5,439,766 | 8/1995 | Day et al. . |
| 5,443,672 | 8/1995 | Stoll et al. . |
| 5,455,459 * | 10/1995 | Fillion et al. ............ 257/760 |
| 5,473,120 * | 12/1995 | Ito et al. ............ 174/264 |
| 5,557,844 | 9/1996 | Bhatt et al. . |
| 5,615,088 * | 3/1997 | Mizumo . |
| 5,654,126 | 8/1997 | Kukanskis et al. . |
| 5,665,526 | 9/1997 | Markovich et al. . |
| 5,667,934 | 9/1997 | Markovich et al. . |
| 5,884,397 * | 3/1999 | Armezzani et al. . |
| 5,949,030 * | 9/1999 | Fasano et al. . |

OTHER PUBLICATIONS

U.S. application No. 08/467,938, Arldt et al., filed Jun. 6, 1995.

U.S. application No. 09/150,824, Day et al., filed Sep. 10, 1998.

U.S. application No. 08/477,373, Day et al., filed Jun. 7, 1995.

U.S. application No. 08/853,211, Russell et al., filed May 8, 1997.

U.S. application No. 09/027,856, Russell et al., filed Feb. 23, 1998.

U.S. application No. 09/158,811, Jones et al., filed Sep. 22, 1998.

U.S. application No. 07/793,889, Allen et al., Nov. 18, 1991.

* cited by examiner

FILLING OPEN THROUGH HOLES IN A MULTILAYER BOARD

BACKGROUND OF THE INVENTION

In printed circuit board fabrication, SLC circuit layers and circuit layers within the conventional printed circuit board are interconnected by through holes which have been drilled and plated. Due to drilling and plating limitations, these plated through holes are quite large with respect to the SLC wiring, and remove valuable wire routing real estate from the SLC layers.

One method of filling holes involves forcing a fill composition, typically a copper filled epoxy composition, through a mask into the holes of the printed circuit board. However, the fill material can bleed between the mask and/or leave nubs at the surface of the filled through hole. This fill process further requires a polishing step after to remove the nubs and the bleed from the surface. The polishing process itself is not perfect. Often times, a small nub will be left after polishing or the fill material may tear out of the hole, leaving a depression at the center of the hole. Both residual nubs and depressions can cause problems during subsequent circuitization steps. The technique of forcing a fill composition through a mask also requires expensive paste, and requires the step of drilling the mask.

Other techniques for filling of holes involve screen printing a liquid epoxy material into the holes, or covering the holes with a dry film. Both of these techniques tend to trap a small air pocket at the center of the hole which can lead to cracking of the overlying circuit lines during thermal cycling.

The filling of vias also encounters similar problems. The screening or tenting processes can cause cracks in the encapsulant materials during thermal cycling. These cracks in the encapsulant will allow moisture penetration to the device, and can also propagate through the encapsulant and cause chip cracking.

It would be desirable to have an inexpensive and efficient technique for reliably and completely filling holes that does not trap air in the through hole, cause bleeding, or leave nubs or depressions at the surface of the filled through holes.

SUMMARY OF THE INVENTION

The present invention provides a novel method of filling apertures, for example, through holes, in substrates. The method utilizes a dielectric film, preferably a photoimageable dielectric film, which is employed to fill the apertures and to form a layer of dielectric film disposed above the substrate at the same time. As a result, the aperture fill is the same material as, and indeed continuous with, the dielectric film which is disposed on the substrate. The method employs the following steps: providing a substrate having apertures; providing a dielectric film disposed atop the substrate covering the apertures, reflowing the dielectric film to flow into the apertures and to form a dielectric film adherent to the substrate, to provide a continuous dielectric extending from the dielectric film into the apertures. In certain embodiments, after filling the apertures in the substrate, the dielectric film is patterned. For example, apertures, such as vias, are defined preferably by photoimaging or laser ablation, in the dielectric film. Preferably, the vias are then metallized, and circuitry formed atop the dielectric film.

The dielectric film preferably has solids which comprise 0 to about 50% of an inorganic particulate and about 50% to about 100% parts of an epoxy resin system; the epoxy resin system having: from about 10 to about 80% of phenoxy polyol resin which is the condensation product of epichlorohydrin and bisphenol A, having a molecular weight of from about 40,000 to 130,000, from about 20 to 90% of an epoxidized multifunctional bisphenol A formaldehyde novolac resin having a molecular weight of from about 4,000 to about 10,000, from about 35% to about 50% of a diglycidyl ether of bisphenol A having a molecular weight of from about 600 to about 2,500; and from about 0.1 to 15 parts by weight of the total resin weight, a cationic photoinitiator.

The invention also relates to circuitized structures produced according to the methods.

DETAILED DESCRIPTION OF THE INVENTION

Figure 1:
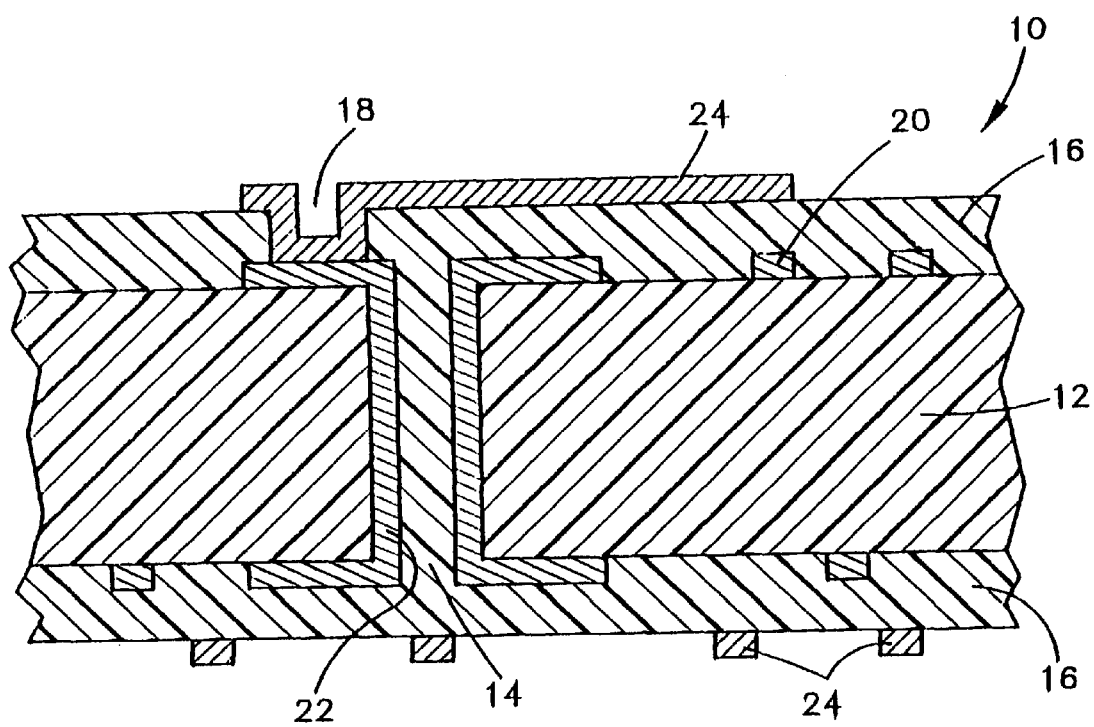
FIG. 1 is a cross section of a circuitized structure of the present invention.

The present invention provides a novel method of filling apertures, such as through holes in substrates; the method utilizes a dielectric film, preferably a photoimageable dielectric film, which is heated to flow into the through holes and to form a dielectric film disposed on the substrate. As a result, the composition, that is the "film" disposed in the through hole is the same as, and indeed continuous with the, composition of the dielectric film which is disposed above the substrate. After filling, additional apertures, such as vias, are defined in the dielectric film preferably by photoimaging. The apertures are preferably metallized, and circuitry is formed on the dielectric film.

The Dielectric Film

The dielectric film is an organic film, preferably an epoxy material. Suitable photoimageable compositions for making the photoimageable dielectric are disclosed in U.S. Pat. No. 5,026,624 to Day, et. al., issued Jun. 25, 1991 and U.S. Pat. No. 5,300,402 to Card, et al., issued Apr. 5, 1994; U.S. Pat. No. 5,264,325 to Allen, et al., issued Nov. 23, 1993, which are specifically incorporated herein by reference. Preferably the dielectric constant of the dielectric film is less than about 5, more preferably less than about 4.

Other dielectric materials suitable for forming the dielectric film and filling apertures are epoxy resins; such epoxy resins are commercially available; for example epoxy acrylate liquid dielectric compositions such as Taiyo PSR-4000 from Taiyo Company, Enthone DSR 3241 from Enthone-OMI, Inc., Dupont Vacrel, and Dupont Vialux dry film. However, such epoxy acrylates are not particularly suited to photoimaging vias in the dielectric film, and are less preferred.

The dielectric film is comprised of solids and solvent. The solids of the preferred embodiment are comprised of an epoxy resin system. The epoxy resin system comprises: from about 10 to about 80%, preferably from about 20 to about 40%, more preferably about 30%, of phenoxy polyol resin which is the condensation product of epichlorohydrin and bisphenol A, having a molecular weight of from about 40,000 to about 130,000, preferably about 60,000 to about 90,000, more preferably greater than 60,000; from about 20 to about 90%, preferably from about 25 to about 30%, most preferably about 25%, of an epoxidized multifunctional bisphenol A formaldehyde novolac resin having a molecular weight of from about 4,000 to about 10,000, preferably about 5,000 to about 7,000; from 0 to about 50%, preferably from about 35 to about 50%, more preferably about 40 to about 45%, most preferably about 45%, of a diglycidyl ether of bisphenol A having a molecular weight of from about 600 to 2,500, preferably about 1,000 to about 1,700; from about 0.1 to 15 parts, preferably about 5 parts, by weight of the total resin weight, a cationic photoinitiator. The solvent component of the dielectric film preferably is comprised of propyleneglycol monomethyl ether acetate and 0 to less than about 10% propylene carbonate. The propylene carbonate is preferably the carrier for the preferred photoinitiator.

Optionally, the dielectric film contains an electrically insulating inorganic particulate, such as for example alumina oxides, alumina nitrides, and silicon dioxide; silicon dioxide is preferred. The inorganic particulate preferably has a particle size of less than 10 microns, more preferably less than about 5 microns. The inorganic particulate is optionally present in the dielectric film from 0 to about 50%, preferably from about 0.01% to about 50% of the total solids weight; for the embodiments described herein, the inorganic particulate is present typically from about 0.5% to about 25%, more preferably from about 1% to about 10%, most preferably about 1.5 to about 5% of the total solids weight. Depending upon the application, the inorganic particulate may be present from about 20% to about 30%, preferably about 25% of the total solids weight.

Preferably the phenoxy polyol resin has an epoxide value of from about 0.001 to about 3, more preferably from about 0.01 to about 0.3, most preferably about 0.03 equivalents per kg, a weight per epoxide of from about 10,000 to about 60,000, more preferably from about 20,000 to about 50,000, most preferably about 37,000.

Preferably, the multifunctional epoxy bisphenol A formaldehyde novolac resin has an epoxide value of from about 1 to about 10 more preferably from about 3 to about 6, most preferably about 4.7 equivalents per kilogram, a weight per epoxide of from about 180 to about 300, more preferably from about 190 to about 230, most preferably about 215 and a melting point of from about 60° to about 150°, more preferably from about 70° to about 90°, most preferably about 82° C.

The diglycidyl ether of bisphenol A is preferably halogenated, more preferably brominated. Preferably, the diglycidyl ether of the bisphenol A has an epoxide value of from about 0.1 to about 5, more preferably from about 1 to about 3, most preferably about 1.5 equivalents per kilogram, a weight per epoxide of from about 200 to about 1000, more preferably from about 500 to about 750, most preferably about 675 and a melting point of from about 700 to about 150°, more preferably from about 80° to about 110°, most preferably about 97° C.

A suitable phenoxy polyol resin is available under the trade name "PKHC", formerly available from Union Carbide Corporation, now available from Phenoxy Resin Associates. A suitable octafunctional bisphenol A formerly available under the trade name Epirez SU-8 from High Tek Polymers, is now available as "Epon SU8" from Shell Chemical Company. A suitable diglycydl ether of bisphenol A is a tetrabromobisphenol A formerly available under the trade name "Epirez 5183" from High Tek Polymers, is now available as "Epon 1183" from Shell Chemical Company. A suitable complex triarylsulfonium hexafluoroantimonate salt photoinitiator formerly available under the trade name UVE 1014 from General Electric Company, is now available as UVI 6974 from Union Carbide Company.

The dielectric film is thermally stable particularly at lamination temperatures; preferably the dielectric film is stable up to at least 125° C. for 1 hour.

Forming the Dielectric Film

First a liquid dielectric is prepared by combining the epoxy resins, and photoinitiators, if present and solvent and mixing thoroughly. Solvent is employed to permit thorough mixing. Alternatively, various components are premixed in batch form. When employing silica, the liquid dielectric requires sufficient mixing to evenly disperse the silica. Suitable mixers include for example vacuum high shear dispersion mixers.

The dielectric film is prepared by coating a liquid dielectric onto a support, preferably a polymeric support, such as polyester. Suitable polyester support for the photoresist film, includes, for example, polyethylene terephthalate available under the trade name MYLAR®, from DuPont, and MELINEX from ICI. The dielectric film is applied to the polymeric support in liquid form or paste form, using conventional application methods such as, for example, curtain coating, screen coating, roller coating or spray coating.

The Method

A substrate is provided, such as, for example, non-circuitized power cores, stiffeners, circuitized substrates such as circuit boards, cards, carriers, organic and inorganic single chip modules, organic or inorganic multi-chip modules, ceramic carriers and interposer cards.

The dielectric film preferably has a solvent content in an amount sufficient to prevent cracking and provide plasticity to the dielectric film during handling. The solvent content in the dielectric film, preferably ranges from about 5% to about 30%, by weight, more preferably from about 9% to about 15%. Good results have been obtained using solvent content of from about 11% to about 13.5%. The dielectric film is placed film-side down and adhered to the substrate through application of heat and pressure, preferably by vacuum or hot roll lamination. The film is applied to one or both sides of the substrate. Liquid dielectric materials which dry to a dielectric film are preferably applied by screen printing. After the film is disposed on the substrate, the backing, if present, is removed and the solvent is driven off from the dielectric film to provide a solvent content preferably less than about 5%, more preferably less than about 1%. The dielectric film is air dried, or to hasten the removal of the solvent, it is heated. Suitable techniques for driving off solvent include for example, ramp or step heating. For example, the solvent is driven off slowly by initially heating at low temperature such as about 50° C. and gradually increasing the temperature to about 125° C.; or the solvent is driven off by drying in a two step procedure such as, for example, drying at from about 40° to about 70° C. then drying at a higher temperature, such as, for example, about 90° to about 140° C., more preferably about 90° to about 125° C.

Preferably a single step is used to fill the through holes with the dielectric film and to form a dielectric film disposed above the through holes and connected to the dielectric film in the through holes. Preferably a lamination press, more preferably vacuum lamination press, is used to impart pressure and temperature to the dielectric film to cause the dielectric film to flow into the through holes and to form a level, planar dielectric film atop the substrate. The dielectric film is applied to one or both sides of the substrate. Good results have been obtained using a vacuum lamination press at about 500 psi, at about 125° C. for about 1 hour.

Where apertures such as vias, are desired in the dielectric film, such apertures are formed preferably by one of two methods. In one method, the dielectric film is exposed to actinic radiation using conventional techniques. Preferably, the dielectric film is exposed to ultraviolet light through desired artwork which is preferably in contact with the dielectric film, to expose areas corresponding to the position of the desired vias. The dielectric film is then baked to partially cure the dielectric film which has been exposed to the actinic radiation. The dielectric film is then developed, preferably using propylene carbonate or butyrolactone to provide a photoimaged dielectric film, in which the dielectric film has apertures, preferably vias, disposed therein. Where it is desired that the vias connect to the dielectric filled plated through holes, the via can be defined to terminate in contact with the copper perimeter of the land surrounding the plated through hole.

The dielectric film is then finally cured, preferably in a two step process, first involving an exposure to ultraviolet light in the range of about 250 to about 400 nm, followed by a thermal cure. Good thermal cures have been obtained in a convection oven at about 150° C. to about 180° C. for 30 to 90 minutes. Conventional techniques are then employed to metallize the apertures, such as vias if desired, and to form circuitry atop the dielectric film.

Alternatively, apertures, such as vias are formed in the dielectric film by laminating a metal foil, preferably copper foil, to the dielectric film during the reflow step. The foil is then preferably etched to thickness of about 5 microns, and a conventional photoresist is applied atop the foil. The photoresist is then photoimaged employing conventional techniques to provide the desired via pattern. The areas of the foil not covered by photoresist are then etched away leaving the via pattern in the copper foil. Next, the photoresist is removed and the vias are formed in the dielectric film by dissolving away portions of the dielectric film below the "vias" in the foil with a solvent, or removing by laser ablation. Suitable solvents are those used to develop the dielectric composition; good results have been obtained using propylene carbonate. The vias are then metallized using conventional techniques such as plating. The foil is metallized at the same time or after the vias; the foil serves as the base for the circuitry.

The resulting circuitized structures include for example, circuit boards, cards, carriers, organic and inorganic single chip modules, organic or inorganic multi-chip modules, ceramic carriers and interposer cards.

As a result of the methods of the present invention, a circuitized structure is produced. As shown in FIG. 1, the circuitized structure 10, is comprised of: substrate 12, circuitization through holes or vias 14 disposed in substrate 12, circuit lines 20, a cured photoimaged, dielectric film 16 having photopatterned vias 18, and circuitry 24 disposed on substrate 12. Through holes or vias 14 have plating 22 disposed along the walls, and are filled with cured dielectric which is continuous with dielectric of dielectric film 16. The circuitization 24 on the dielectric film 16 is electrically connected to the through holes or vias 14 on the substrate 12 by the photopatterned vias 18.

The following examples are illustrative and not intended to limit the scope of the invention.

EXAMPLE 1

A standard sub-composite circuitized printed circuit board having drilled, plated through holes was provided. The panel was chlorited, using a conventional Shipley Black Oxide process.

A photoimageable dielectric composition was prepared having a solids content of from about 86.5% to about 89%, such solids comprising: about 27.44% PKHC a phenoxy resin; 41.16% of Epirez 5183 a tetrabromobisphenol A; 22.88% of Epirez SU-8, an octafunctional epoxy bisphenol A formaldehyde novolac resin, 4.85% UVE 1014 photoinitiator; 0.07% ethylviolet dye; 0.03% FC 430 a fluorinated polyether nonionic surfactant from 3M Company; 3.85% Aerosil 380, an amorphous silicon dioxide from Degussa. The solvent content is typically greater than about 20%. The solvent was a mixture of methyl ethyl ketone and propylene glycol monomethyl ether acetate. The photoimageable dielectric composition was coated onto a 1.42 mil thick polyethylene terephthalate designated "Mylar D", a polyester carrier from Dupont. The photoimageable dielectric composition was allowed to dry to provide a 2.8 mil thick photoimageable dielectric film on the polyethylene terephthalate carrier, to provide a solvent content of from about 11% to about 13.5% of the total weight of the dielectric film.

The dielectric film was applied to both sides of the panel and the panel was "soft baked" at 125° C. for 60 minutes to substantially remove the solvent from the dry film; the solvent content was reduced to about 1% or less. The panel was placed in a lamination press so that the dielectric film was adjacent to a release sheet on either side of the panel. The panel was laminated at 125° C. for 60 minutes, to reflow the dielectric film. Following the lamination, the panel was exposed to ultraviolet light through a film mask having 4 mil via pattern, the panel was baked at 125° C. for 1 hour, and the dielectric film was developed to form the photo vias. Next, the dielectric film was UV bumped, that is, exposed to 4 Joules/cm$^2$, ultraviolet light and then baked at 180° C. for 1 hour.

The resulting structure had completely filled through holes with no air gaps, and a very uniform and planar dielectric film having a surface thickness of 1.5 mils. Subsequently, the dielectric surface was roughened by conventional mechanical and/or chemical techniques and then the vias were metallized using conventional plating techniques, and circuit lines were defined atop the dielectric film.

EXAMPLE 2

The same process as in Example 1 was used, except a rough surface copper foil was placed against the dielectric surfaces during lamination. Following lamination, the copper foil was blanket etched from the panels leaving a replicate surface of the copper foil in the dielectric.

Photo vias were defined in the dielectric film. Subsequently, the vias were metallized, using conventional plating techniques, and circuit lines were defined atop the dielectric film. The dielectric roughening prior to metallization was not performed.

The resulting structure had completely filled, plated through holes without air gaps and a uniform, planar, rough dielectric film surface having a thickness of 1.5 mils.

EXAMPLE 3

The dielectric film and copper foil were laminated as in Example 2. After lamination, the copper foil was etched down to a thickness of about 5 microns using conventional cupric chloride etch. Next, a conventional acrylate dry film photoresist, Hercules CFI 1.5, was applied atop the etched copper foil, and a via pattern was photoimaged, that is exposed to ultraviolet light and developed using sodium carbonate, in the conventional photoresist. The via pattern was then etched in the copper foil, and the photoresist was stripped using sodium hydroxide. Vias were then developed in the dielectric material, using the etched copper foil as a develop mask. That is, vias were created in the dielectric, below the openings in the etched foil, by removing portions of the dielectric with a developing solvent, propylene carbonate. The dielectric was then thermally cured at 190° C. for two hours. The vias were then metallized and circuits were formed by plating copper circuits atop the etched copper foil, and flash etching the base foil.

Cross sections of the circuitized structures prepared in Examples 1 and 2 were examined under magnification of about 100X, 250X. The cross sections of the dielectric film and the dielectric through hole were found to be free of voids. Cross sectional analysis of the photovias revealed regular, straight walls. Circuitized structures produced according to Examples 1 and 2 indicated that circuits were continuous and the circuitization atop the dielectric film was in electrical communication with the through holes.

The method of the present invention provides filled plated through holes in a very cost effective manner. The method of the present invention eliminates the need for a two step process of filling through holes and forming a dielectric film, by accomplishing both in a single step. The method of the present invention eliminates the need for through hole fill composition, removes the need for removing nubs, removes the need to planarize the dielectric film and increases yield by reducing loss due to downstream processing problems such as etch problems due to non-planar surface and incomplete nub removal and tearout during nub removal. A further advantage of the present invention is that a very planar surface is produced; there is less than 0.0001" surface variation versus 0.0002"–0.0007" variation which results from conventional techniques. Due to the very planar surface that is produced, the wiring density is even greater; spacing between wiring is typically less than 0.003 inches, typically from about 0.002 to 0.003 inches. Conventional hole fill techniques typically produced spacing between wires of about 0.004 inches or greater.

The methods of the present invention are useful to fill apertures to prevent encapsulation materials from flowing into the holes.

What is claimed is:

1. A circuitized structure comprising:
   a. a circuitized substrate having opposed faces;
   b. plated through holes disposed in said substrate extending from one face to the other and open at both ends;
   c. a cured, patterned, dielectric film, disposed on and in contact with the substrate, wherein the dielectric film extends into and fills the plated through holes in the substrate;
   d. metallized, patterned, vias disposed in the dielectric film, said vias in electrical contact with the plated through holes; and
   e. circuitization disposed on, and adherent to the dielectric film, the circuitization on the dielectric film being electrically connected to the plated through holes which are in electrical connection with the circuitization disposed on the substrate.

2. A circuitized structure of claim 1, wherein the dielectric film comprises solids comprising:
   from about 50% to about 100% of an epoxy resin system comprising:
   i. from about 10 to 80% of phenoxy polyol resin which is the condensation product of epichlorohydrin and bisphenol A, having a molecular weight of from about 40,000 to 130,000;
   ii. from about 20 to 90% of an epoxidized multifunctional bisphenol A formaldehyde novolac resin having a molecular weight of from about 4,000 to 10,000;
   iii. from 0 to 50% of a diglycidyl ether of bisphenol A having a molecular weight of from about 600 to 2,500;
   iv. from about 0.1 to 15 parts by weight of the total resin weight, a cationic photoinitiator; and
   from 0 to 50% of an inorganic particulate.

3. The circuitized structure of claim 1, wherein said dielectic film is comprised of:
   from about 10 to 80% of phenoxy polyol resin which is the condensation product of epichlorohydrin and bisphenol A, having a molecular weight of from about 40,000 to 130,000;
   from 20 to 40% of phenoxy polyol resin having a molecular weight of from about 60,000 to 90,000;
   from about 25 to 30% of an epoxidized multifunctional bisphenol A formaldehyde novolac resin having a molecular weight of from about 5,000 to 7,000;
   from about 35 to 50%, of a diglycidyl ether of bisphenol A having a molecular weight of from about 1,000 to 1,700.

4. The circuit board of claim 3, wherein said dielectric film is comprised of:
   about 30% of phenoxy polyol resin having an epoxide value of about 0.03 equivalents per kg, a weight per epoxide of about 37,000 and a glass transition temperature of about 98° C.;
   about 25% of an octafunctional epoxy bisphenol A formaldehyde novolac resin having an epoxide value of about 4.7 equivalents per kilogram, as weight per epoxide of about 215 and a melting point of about 82° C.;
   about 45% diglycidyl ether a tetrabromobisphenol A having an epoxide value of about 1.5 equivalents per kilogram, a weight per epoxide of about 675 and a melting point of about 97° C.;
   about 5 parts by weight of the resin weight complex triarylsulfonium hexafluoroantimonate salt photoinitiator;
   about 0.1% to about 10% of the inorganic particulate which is comprised of silicon dioxide.

5. The circuitized structure of claim 1, wherein the circuitized structure is circuitized to form a circuit board, card, carrier, organic or inorganic single chip module, organic or inorganic multi-chip module, ceramic carrier or interposer card.

6. The circuitized structure of claim 1, wherein the circuitized structure is circuitized to form a printed circuit board.

7. The circuitized structure of claim 1, wherein the circuitization disposed atop the dielectric film is comprised of a copper base and plated copper disposed on the copper base.

8. A method for filling plated through holes in circuitized substrates having opposed faces, comprising the following steps:
   a. providing a circuitized substrate having plated through holes therein extending from one face to the other and open at both ends; and a dielectric film disposed on the substrate covering the plated through holes,
   b. reflowing the dielectric film into the plated through holes in the substrate, to provide a dielectric film adherent to the substrate, and to provide a continuous dielectric extending from the dielectric film into the apertures,
   c. forming vias in the dielectric film communicating with said plated through holes; and d. metallizing the vias in the dielectric film and providing circuitization on the dielectric film to connect to the plated through holes.

9. The method of claim 8, further comprising the steps of patterning the dielectric film in step c to define said vias in the dielectric film.

10. The method of claim 8, further comprising the steps of:
   (c) laminating metal foil to the dielectric film during or after step (b);
   (d) then creating a via pattern in the metal foil;
   (e) then forming vias in the dielectric film corresponding to the aperture pattern in the metal foil.

11. The method of claim 10, further comprising the steps of metallizing the vias in the dielectric film and metallizing the foil.

12. The method of claim 8, wherein the dielectric film has a solvent content of from about 5 to 30%.

13. The method of claim 8, wherein the dielectric film has solids which comprise:
   from about 50 to 100% of an epoxy resin system which comprises:
      i. from about 10 to 80% of phenoxy polyol resin which is the condensation product of epichlorohydrin and bisphenol A, having a molecular weight of from about 40,000 to 130,000;
      ii. from about 20 to 90% of an epoxidized multifunctional bisphenol A formaldehyde novolac resin having a molecular weight of from about 4,000 to 10,000; and
      iii. from about 35 to 50% of a diglycidyl ether of bisphenol A having a molecular weight of from about 600 to 2,500;
      iv. from about 0.1 to 15 parts by weight of the total resin weight, a cationic photoinitiator; and
   from 0 to 50% of an inorganic particulate.

14. The method of claim 13, wherein the epoxy resin system comprises:
   from 20 to 40% of phenoxy polyol resin having a molecular weight of from about 60,000 to 90,000;
   from about 25 to 30% of an epoxidized multifunctional bisphenol A formaldehyde novolac resin having a molecular weight of from about 5,000 to 7,000;
   from about 35 to 50%, of a diglycidyl ether of bisphenol A having a molecular weight of from about 1,000 to 1,700; and
   the solids comprise from about 0.01% to 50% of and inorganic particulate.

15. The method of claim 14, wherein the epoxy resin system has:
   about 30% of the phenoxy polyol resin having an epoxide value of about 0.03 equivalents per kg, a weight per epoxide of about 37,000 and a glass transition temperature of about 98° C.;
   about 25% of the octafunctional epoxy bisphenol A formaldehyde novolac resin having an epoxide value of about 4.7 equivalents per kilogram, as weight per epoxide of about 215 and a melting point of about 82° C.;
   about 45% of the diglycidyl ether, which is a tetrabromobisphenol A having an epoxide value of about 1.5 equivalents per kilogram, a weight per epoxide of about 675 and a melting point of about 97° C.;
   about 5 parts by weight of the resin weight complex of the triarylsulfonium hexafluoroantimonate salt photoinitiator; and the solids comprise 0.1% to 10% of the inorganic particulate.

16. The method of claim 13, wherein the circuitized structure is a circuit board, card, carrier, organic or inorganic single chip module, organic or inorganic multi-chip module, ceramic carrier or interposer card.

17. The method of claim 9, wherein the dielectric film has solids which comprise:
   from about 50 to 100% of an epoxy resin system which comprises:
      i. from about 10 to 80% of phenoxy polyol resin which is the condensation product of epichlorohydrin and bisphenol A, having a molecular weight of from about 40,000 to 130,000;
      ii. from about 20 to 90% of an epoxidized multifunctional bisphenol A formaldehyde novolac resin having a molecular weight of from about 4,000 to 10,000; and
      iii. from about 35 to 50% of a diglycidyl ether of bisphenol A having a molecular weight of from about 600 to 2,500;
      iv. from about 0.1 to 15 parts by weight of the total resin weight, a cationic photoinitiator; and
   from 0 to 50% of an inorganic particulate.

18. The method of claim 17, wherein the epoxy resin system comprises:
   from 20 to 40% of phenoxy polyol resin having a molecular weight of from about 60,000 to 90,000;
   from about 25 to 30% of an epoxidized multifunctional bisphenol A formaldehyde novolac resin having a molecular weight of from about 5,000 to 7,000;
   from about 35 to 50%, of a diglycidyl ether of bisphenol A having a molecular weight of from about 1,000 to 1,700; and
   the solids comprise from about 0.01% to 50% of and inorganic particulate.

19. The method of claim 18, wherein the epoxy resin system has:
   about 30% of the phenoxy polyol resin having an epoxide value of about 0.03 equivalents per kg, a weight per epoxide of about 37,000 and a glass transition temperature of about 98° C.;
   about 25% of the octafunctional epoxy bisphenol A formaldehyde novolac resin having an epoxide value of about 4.7 equivalents per kilogram, as weight per epoxide of about 215 and a melting point of about 82° C.;
   about 45% of the diglycidyl ether, which is a tetrabromobisphenol A having an epoxide value of about 1.5 equivalents per kilogram, a weight per epoxide of about 675 and a melting point of about 97° C.;
   about 5 parts by weight of the resin weight complex of the triarylsulfonium hexafluoroantimonate salt photoinitiator; and the solids comprise 0.1% to 10% of the inorganic particulate.

20. The method of claim 17, wherein the circuitized structure is a circuit board, card, carrier, organic or inorganic single chip module, organic or inorganic multi-chip module, ceramic carrier or interposer card.

21. The method of claim 8, wherein the dielectric film has solids which comprise:
   from about 50 to 100% of an epoxy resin system which comprises:
      i. from about 10 to 80% of phenoxy polyol resin which is the condensation product of epichlorohydrin and bisphenol A, having a molecular weight of from about 40,000 to 130,000;

ii. from about 20 to 90% of an epoxidized multifunctional bisphenol A formaldehyde novolac resin having a molecular weight of from about 4,000 to 10,000; and iii. from about 35 to 50% of a diglycidyl ether of bisphenol A having a molecular weight of from about 600 to 2,500;

iv. from about 0.1 to 15 parts by weight of the total resin weight, a cationic photoinitiator; and from 0 to 50% of an inorganic particulate.

22. The method of claim 21, wherein the epoxy resin system comprises:

from 20 to 40% of phenoxy polyol resin having a molecular weight of from about 60,000 to 90,000;

from about 25 to 30% of an epoxidized multifunctional bisphenol A formaldehyde novolac resin having a molecular weight of from about 5,000 to 7,000;

from about 35 to 50%, of a diglycidyl ether of bisphenol A having a molecular weight of from about 1,000 to 1,700; and the solids comprise from about 0.01% to 50% of and inorganic particulate.

23. The method of claim 22, wherein the epoxy resin system has:

about 30% of the phenoxy polyol resin having an epoxide value of about 0.03 equivalents per kg, a weight per epoxide of about 37,000 and a glass transition temperature of about 98° C.;

about 25% of the octafunctional epoxy bisphenol A formaldehyde novolac resin having an epoxide value of about 4.7 equivalents per kilogram, as weight per epoxide of about 215 and a melting point of about 82° C.;

about 45% of the diglycidyl ether, which is a tetrabromobisphenol A having an epoxide value of about 1.5 equivalents per kilogram, a weight per epoxide of about 675 and a melting point of about 97° C.;

about 5 parts by weight of the resin weight complex of the triarylsulfonium hexafluoroantimonate salt photoinitiator; and the solids comprise 0.1% to 10% of the inorganic particulate.

24. The method of claim 21, wherein the circuitized structure is a circuit board, card, carrier, organic or inorganic single chip module, organic or inorganic multi-chip module, ceramic carrier or interposer card.

25. The method of claim 10, wherein the dielectric film has solids which comprise:

from about 50 to 100% of an epoxy resin system which comprises:

i. from about 10 to 80% of phenoxy polyol resin which is the condensation product of epichlorohydrin and bisphenol A, having a molecular weight of from about 40,000 to 130,000;

ii. from about 20 to 90% of an epoxidized multifunctional bisphenol A formaldehyde novolac resin having a molecular weight of from about 4,000 to 10,000; and iii. from about 35 to 50% of a diglycidyl ether of bisphenol A having a molecular weight of from about 600 to 2,500;

iv. from about 0.1 to 15 parts by weight of the total resin weight, a cationic photoinitiator; and from 0 to 50% of an inorganic particulate.

26. The method of claim 25, wherein the epoxy resin system comprises:

from 20 to 40% of phenoxy polyol resin having a molecular weight of from about 60,000 to 90,000;

from about 25 to 30% of an epoxidized multifunctional bisphenol A formaldehyde novolac resin having a molecular weight of from about 5,000 to 7,000;

from about 35 to 50%, of a diglycidyl ether of bisphenol A having a molecular weight of from about 1,000 to 1,700; and the solids comprise from about 0.01% to 50% of and inorganic particulate.

27. The method of claim 26, wherein the epoxy resin system has:

about 30% of the phenoxy polyol resin having an epoxide value of about 0.03 equivalents per kg, a weight per epoxide of about 37,000 and a glass transition temperature of about 98° C.;

about 25% of the octafunctional epoxy bisphenol A formaldehyde novolac resin having an epoxide value of about 4.7 equivalents per kilogram, as weight per epoxide of about 215 and a melting point of about 82° C.;

about 45% of the diglycidyl ether, which is a tetrabromobisphenol A having an epoxide value of about 1.5 equivalents per kilogram, a weight per epoxide of about 675 and a melting point of about 97° C.;

about 5 parts by weight of the resin weight complex of the triarylsulfonium hexafluoroantimonate salt photoinitiator; and the solids comprise 0.1% to 10% of the inorganic particulate.

28. The method of claim 25, wherein the circuitized structure is a circuit board, card, carrier, organic or inorganic single chip module, organic or inorganic multi-chip module, ceramic carrier or interposer card.

29. The method of claim 11, wherein the dielectric film has solids which comprise:

from about 50 to 100% of an epoxy resin system which comprises:

i. from about 10 to 80% of phenoxy polyol resin which is the condensation product of epichlorohydrin and bisphenol A, having a molecular weight of from about 40,000 to 130,000;

ii. from about 20 to 90% of an epoxidized multifunctional bisphenol A formaldehyde novolac resin having a molecular weight of from about 4,000 to 10,000; and iii. from about 35 to 50% of a diglycidyl ether of bisphenol A having a molecular weight of from about 600 to 2,500;

iv. from about 0.1 to 15 parts by weight of the total resin weight, a cationic photoinitiator; and from 0 to 50% of an inorganic particulate.

30. The method of claim 29, wherein the epoxy resin system comprises:

from 20 to 40% of phenoxy polyol resin having a molecular weight of from about 60,000 to 90,000;

from about 25 to 30% of an epoxidized multifunctional bisphenol A formaldehyde novolac resin having a molecular weight of from about 5,000 to 7,000;

from about 35 to 50%, of a diglycidyl ether of bisphenol A having a molecular weight of from about 1,000 to 1,700; and the solids comprise from about 0.01% to 50% of and inorganic particulate.

31. The method of claim 30, wherein the epoxy resin system has:

about 30% of the phenoxy polyol resin having an epoxide value of about 0.03 equivalents per kg, a weight per epoxide of about 37,000 and a glass transition temperature of about 98° C.;

about 25% of the octafunctional epoxy bisphenol A formaldehyde novolac resin having an epoxide value of about 4.7 equivalents per kilogram, as weight per epoxide of about 215 and a melting point of about 82° C.;

about 45% of the diglycidyl ether, which is a tetrabromobisphenol A having an epoxide value of about 1.5 equivalents per kilogram, a weight per epoxide of about 675 and a melting point of about 97° C.;

about 5 parts by weight of the resin weight complex of the triarylsulfonium hexafluoroantimonate salt photoinitiator; and the solids comprise 0.1% to 10% of the inorganic particulate.

32. The method of claim 29, wherein the circuitized structure is a circuit board, card, carrier, organic or inorganic single chip module, organic or inorganic multi-chip module, ceramic carrier or interposer card.

* * * * *

UNITED STATES PATENT AND TRADEMARK OFFICE
CERTIFICATE OF CORRECTION

PATENT NO. : 6,204,456 B1  
DATED : March 20, 2001  
INVENTOR(S) : John M. Lauffer, Voya R. Markovich, Cheryl L. Palomaki and William E. Wilson It is certified that error appears in the above-identified patent and that said Letters Patent is hereby corrected as shown below:

<u>Title page,</u>  
ABSTRACT, after the last line following the word "film", please add the following:

-- The dielectric film preferably has solids which comprise 0 to about 50% of an inorganic particulate and 50% to 100% parts of an epoxy resin system; the epoxy resin system having: from about 10 to 80% of phenoxy polyol resin which is the condensation product of epichlorohydrin and bisphenol A, having a molecular weight of from about 40,000 to 130,000, from about 20 to 90% of an epoxidized multifunctional bisphenol A formaldehyde novolac resin having a molecular weight of from about 4,000 to 10,000, from about 35% to about 50% of a diglycidyl ether of bisphenol A having a molecular weight of from about 600 to 2,500; and from about 0.1 to 15 parts by weight of the total resin weight, a cationic photoinitiator. The invention also relates to circuitized structures produced according to the methods. --

Signed and Sealed this

Twenty-fifth Day of December, 2001

*Attest:*

JAMES E. ROGAN  
*Attesting Officer*     *Director of the United States Patent and Trademark Office*